United States Patent
Liu et al.

(10) Patent No.: US 7,505,309 B2
(45) Date of Patent: Mar. 17, 2009

(54) STATIC RAM MEMORY CELL WITH DNR CHALCOGENIDE DEVICES AND METHOD OF FORMING

(75) Inventors: Jun Liu, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 11/109,946

(22) Filed: Apr. 20, 2005

(65) Prior Publication Data
US 2006/0239062 A1    Oct. 26, 2006

(51) Int. Cl.
*G11C 7/00* (2006.01)
(52) U.S. Cl. .......................... 365/159; 365/63
(58) Field of Classification Search ................ 365/63, 365/185.01, 230.06, 159, 205
See application file for complete search history.

(56) References Cited

U.S. PATENT DOCUMENTS

| | | | | |
|---|---|---|---|---|
| 4,009,484 | A * | 2/1977 | Ogiue et al. ............... 257/505 |
| 4,236,170 | A * | 11/1980 | Uchida ...................... 257/367 |
| 5,825,687 | A | 10/1998 | Yin et al. | |
| 6,310,798 | B1 | 10/2001 | Morimoto | |
| 6,472,263 | B1 | 10/2002 | Noble | |
| 6,724,655 | B2 | 4/2004 | King | |
| 6,727,548 | B1 | 4/2004 | King | |
| 6,777,705 | B2 * | 8/2004 | Reinberg et al. ............... 257/2 |
| 7,015,494 | B2 * | 3/2006 | Campbell ...................... 257/4 |
| 7,050,327 | B2 * | 5/2006 | Campbell .................... 365/159 |
| 7,329,558 | B2 * | 2/2008 | Campbell ..................... 438/95 |
| 2004/0007749 | A1 | 1/2004 | Campbell | |
| 2004/0202016 | A1 | 10/2004 | Campbell | |
| 2005/0018493 | A1 * | 1/2005 | Casper et al. .......... 365/189.07 |
| 2005/0104105 | A1 | 5/2005 | Campbell | |
| 2005/0201146 | A1 * | 9/2005 | Moore et al. ................ 365/163 |
| 2006/0050545 | A1 * | 3/2006 | Rohr .......................... 365/148 |
| 2006/0197115 | A1 * | 9/2006 | Toda .......................... 257/248 |

OTHER PUBLICATIONS

Paul Beckett, "Towards a Reconfigurable Nanocomputer Platform", Jun. 13, 2003, XP007900897, 4 pages, from http://www.LS.CMU.ed/(Phoenix/nsc1/paper//-2.pdf.
Paul Beckett, "Exploiting Multiple Functionality for Nano-Scale Reconfigurable Systems", Proceedings of the Great Lakes Symposium on VLSI 2003, pp. 50-55.
Jon Maimon, et al., "Chalcogenide-Based Non-Volatile Memory Technology", Aerospace Conference 2001, Mar. 10-17, 2001, Piscataway, N.J., pp. 2289-2294, XP10548238.
J. P. A. Van Der Wagt, "Tunneling-Based SRAM", Proceedings of the IEEE, N.Y., vol. 87, No. 4, Apr. 1999, pp. 571-595, XP000902775.
Rommel et al., "Room temperature operation of epitaxially grown $Si/Si_{0.5}Gei_{0.5}/Si$ Resonant interband tunneling diodes," *Applied Physics Letters*, vol. 73, No. 15, Oct. 12, 1998, pp. 2191-2193.

(Continued)

*Primary Examiner*—Michael T Tran
(74) *Attorney, Agent, or Firm*—Dickstein Shapiro LLP

(57) ABSTRACT

An SRAM memory device having improved stability including two series connected devices, at least one of the devices being a chalcogenide device exhibiting differential negative resistance characteristics. One of the two devices serves as the load of the other. A switch is provided to bias a middle input node and switch the memory device between two logic states.

28 Claims, 6 Drawing Sheets

OTHER PUBLICATIONS

Wang et al., "Silicon tunnel Diodes Formed by Proximity Rapid Thermal Diffusion," *2002 Lester Eastman Conference on High Performances Devices*, Department of Electrical Engineering, Center for Nano Science and Technology, University of Notre Dame, IN, www.nd.edu/~aseabaug.

* cited by examiner

STATIC RAM MEMORY CELL WITH DNR CHALCOGENIDE DEVICES AND METHOD OF FORMING

FIELD OF THE INVENTION

The present invention relates to memory circuits, in particular, to improved static random access memory cells using differential negative resistance (DNR) devices.

BACKGROUND OF THE INVENTION

There are a variety of different memory devices available for use in electronic systems. The type of memory device chosen for a specific application depends largely upon what features of the memory are best suited to perform the particular function. For instance, dynamic random access memories (DRAMs) and static random access memories (SRAMs) are used to temporarily store program information and data "actively" being used by a microprocessor or other control device.

Random access memories tend to provide greater storage capability and programming options and cycles than read only memories, but they must be continually powered in order to retain their content. Most dynamic random access memories store data in the form of charged and discharged capacitors contained in an array of memory cells. Such memory cells, however, are volatile in that the stored charges will dissipate after a relatively short period of time because of the natural tendency of an electrical charge to distribute itself into a lower energy state. For this reason, most dynamic random access memories must be periodically refreshed, that is, the stored value must be rewritten to the cells, for example, every 100 milliseconds in order to retain the stored data in the memory cells. Even SRAMs, which do not require refreshing, will only retain stored data as long as power is supplied to the memory device. When the power supply to the memory device is turned off, the data is lost.

Efforts have been underway to create a commercially viable memory device that is programmable, randomly accessed, and nonvolatile. To this end, various implementations of such nonvolatile random access memory devices are presently being developed which store data in a plurality of memory cells by structurally, chemically, or magnetically changing the resistance across the memory cells in response to predetermined voltages respectively applied to the memory cells. Examples of such variable resistance memory devices include those based on polymers, perovskites, doped amorphous silicon, magnetic devices, and chalcogenide glass.

In many variable resistance memory cells, a first value may be written thereto by applying a voltage having a predetermined level to the memory cell, which changes the electrical resistance through the memory cell relative to the condition of the memory cell prior to the application of the voltage. A second value, or the default value, may be written to or restored in the memory cell by applying a second reverse polarity voltage to the memory cell, to thereby change the resistance through the memory cell back to the original level. The second voltage may or may not have the same magnitude as the first voltage. Each resistance state is stable, so that the memory cells are capable of retaining their stored values without being frequently refreshed.

Memory cell structures employing chalcogenide materials as the resistance switching backbone may also be suitably conditioned to exhibit a differential negative resistance (DNR) property. DNR chalcogenide devices have a larger peak-to-valley current-voltage ratio than chalcogenide devices used as memory cells as well as other properties which make them exhibit a differential negative resistance. As a result, DNR chalcogenide devices have greater stability, and hence less power consumption and faster switching speed than conventional devices. The properties and methods of making DNR chalcogenide devices are described in greater detail in U.S. patent application Ser. No. 10/410,567, filed Apr. 10, 2003 to Campbell (Pub. No. US 2004/0202016) and U.S. patent application Ser. No. 10/193,529, filed Jul. 10, 2002, to Campbell (Pub. No. U.S. 2004/0007749), the entirety of which are incorporated herein by reference.

RAM cell densities have increased dramatically with each generation of new designs and have served as one of the principal technology drivers for ultra large scale integration in integrated circuit manufacturing. Typically, SRAM devices consist of at least four transistors. For example, FIG. 1a illustrates a basic six transistor cell with NMOS load devices and FIG. 1b illustrates a four transistor cell with resistor load pull-up devices. With four or six transistor cells, SRAM cell density is limited.

One attempt to reduce the circuit components and thus the size of an SRAM is shown in FIG. 2. A pair of Esaki diodes or resonant tunneling diodes are connected in series; however, their peak-to-valley current-voltage ratio is typically less than 9, thus sacrificing circuit stability for a smaller chip size. Thus, an SRAM circuit having improved stability, non-volatility and decreased power consumption is desirable.

BRIEF SUMMARY OF THE INVENTION

The invention relates to static random access memory (SRAM) cells and associated formation techniques. Various exemplary embodiments employ differential negative resistance (DNR) chalcogenide devices.

Exemplary embodiments of the present invention provide an SRAM which includes two DNR chalcogenide devices; one DNR chalcogenide device serves as the load of the other. The memory cell is fabricated by serially connecting the two DNR chalcogenide devices which may be vertical stacked to create a small footprint design. Alternatively, the cell may be fabricated by placing the two serially connected DNR chalcogenide devices in a side-by-side layout. In another exemplary embodiment, the SRAM includes one DNR chalcogenide serially connected to a reversely biased diode.

DETAILED DESCRIPTION OF THE INVENTION

Although this invention will be described in terms of certain exemplary embodiments, other embodiments that are apparent to those of ordinary skill in the art are also within the scope of this invention. Accordingly, the scope of the invention is defined only by reference to the appended claims.

The term "substrate" used in the following description may include any supporting structure including but not limited to a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures; however, materials other than semiconductors can be used as well so long as they are suitable to support an integrated circuit. When reference is made to a substrate or wafer in the following description, previous process steps may have been utilized to form regions or junctions in or over a base semiconductor or foundation.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

The invention provides an SRAM memory cell, and an array of such cells, each cell includes two serially connected DNR chalcogenide devices having a common input/output node between them; one DNR chalcogenide device serves as the load of the other. Each DNR chalcogenide device comprises a top and bottom electrode and a chalcogenide layer having a resistance variable region. When the appropriate bias is applied to the cell, three operating points exist. One of the points is unstable, while two of the operating points are stable, with one of them provided at low-voltage and the other at high-voltage at the input/output node. The memory cell can be switched between the low-voltage and the high-voltage states by pulsing the middle input/output node with either a low voltage or high voltage.

As explained in co-pending application Ser. No. 10/410, 567, chalcogenide devices can be made to exhibit DNR operational mode at negative bias when the devices are annealed, when silver layers are added to the resistance variable region thereof, and when a negative voltage pulse is applied to the structure at its top electrode. The DNR mode stays stable at room temperature, maintaining a peak-to-valley current-voltage ratio of about 130, but can tolerate temperatures over 200° C. without losing functionality. As a result of the high peak-to-valley ratio, the DNR-based static RAM can operate stably with minimum power and faster switching speed than conventional devices. This memory technology is also compatible with dominant silicon-based CMOS technology.

Figure 1A:
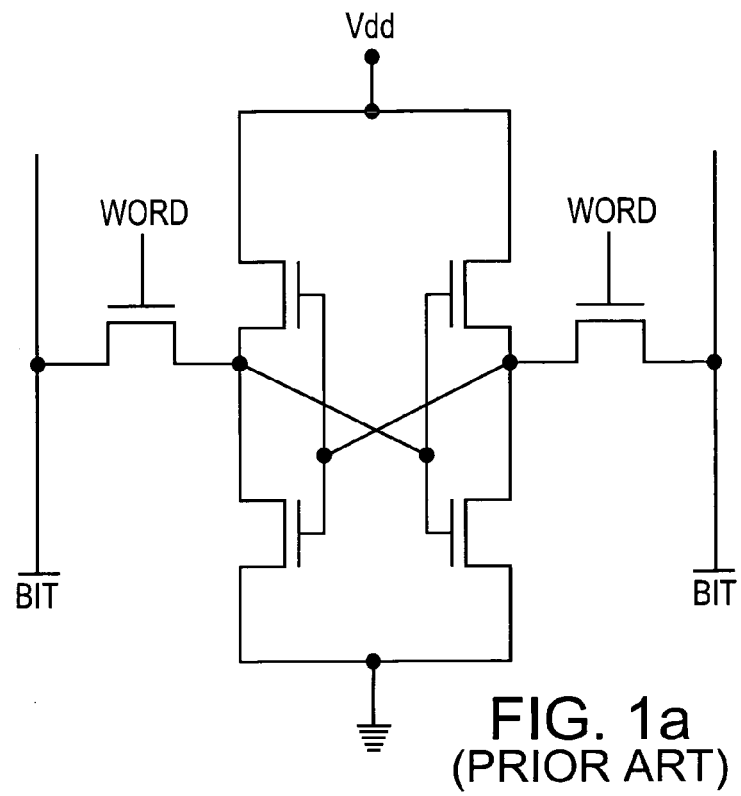
FIG. 1a is a circuit diagram of a conventional RAM memory cell employing six transistors.
Figure 1B:
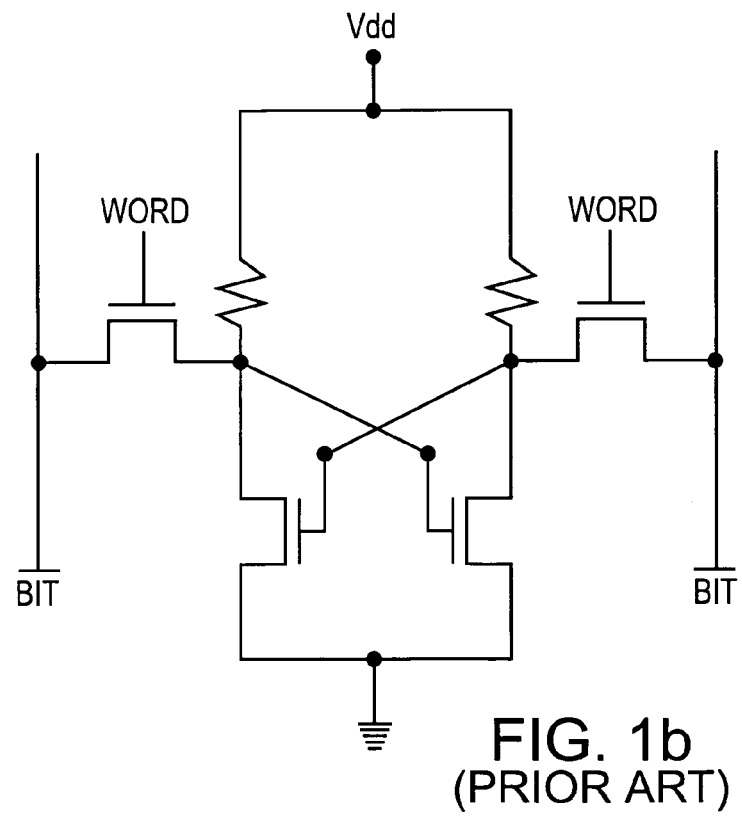
FIG. 1b is a circuit diagram of a conventional SRAM memory cell employing four transistors and resistor load pull-up devices.
Figure 2:
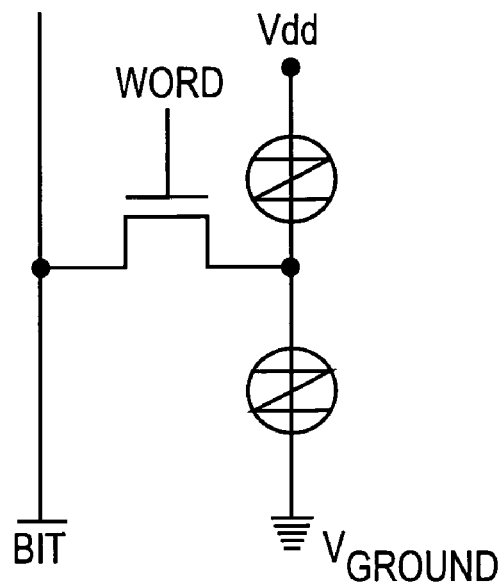
FIG. 2 is a circuit diagram of a conventional memory cell employing resonance tunneling diodes.
Figure 3:
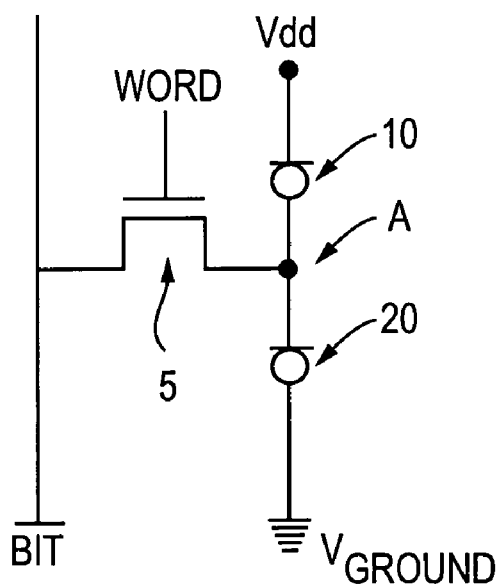
FIG. 3 is a circuit diagram of a memory cell according to an exemplary embodiment of the present invention.

The invention will now be explained with reference to the accompanying figures. FIG. 3 illustrates an exemplary embodiment of the present invention. A first DNR chalcogenide device 10, the construction of which is described below, is connected in series to a second DNR chalcogenide device 20. Second DNR chalcogenide device 20 acts as the load for first DNR chalcogenide device 10. A transistor switch 5 controlled by a signal on a word line applies a voltage from a voltage on a bit line to a node A between the two devices 10, 20 to switch the memory. Node A also outputs the stored state of the memory back to the bit line when the word line is activated by a signal.

The manner of constructing and operating a DNR chalcogenide device, e.g., 10, 20, and its operating characteristics are described in detail in application Ser. Nos. 10/410,567 and 10/193,529.

Figure 4:
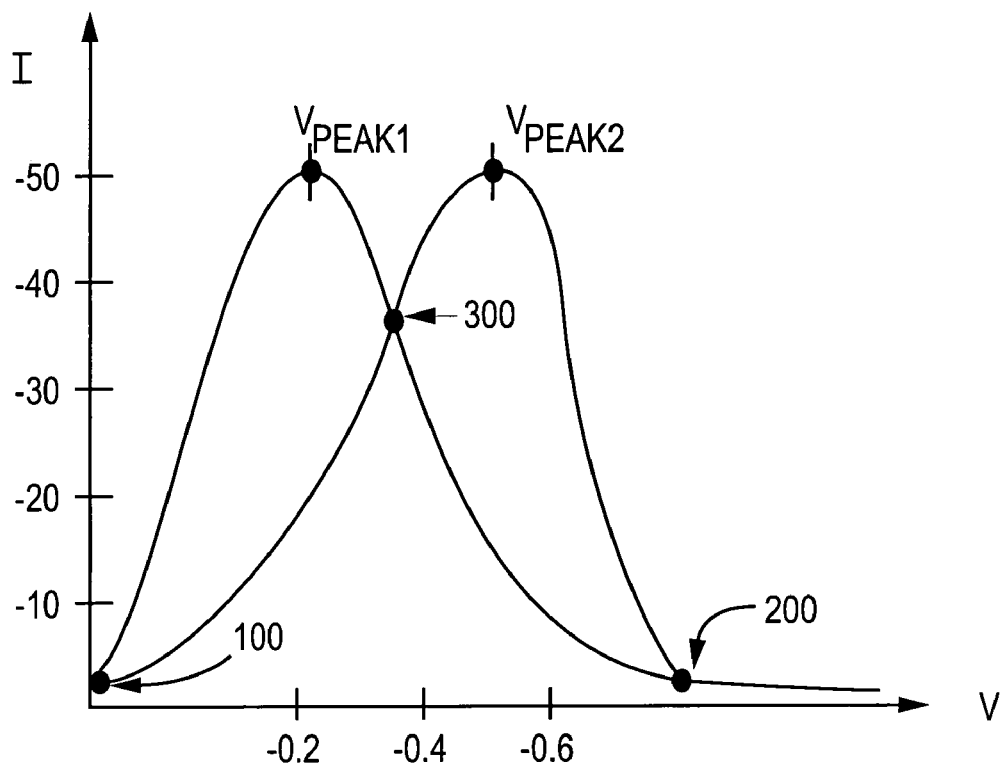
FIG. 4 is a current-voltage graph showing operation of the invention.

FIG. 4 illustrates a load-line current-voltage characteristic of the circuit of FIG. 3. The two curves respectively represent the current/voltage relationships of the DNR chalcogenide devices 10 and 20. The horizontal axis shows the voltage on the node A while the vertical axis shows the current. Three operating points exist for the circuit. Points 100, 200 are stable operating points. Point 300 is unstable. This condition occurs when both DNR chalcogenide devices 10, 20 have the same current and voltage and are therefore biased at the same operating point 300.

In operation, a low voltage state may be programmed to the device when a positive voltage is provided to the word line to turn on the transistor switch 5. A voltage pulse of zero is applied to the bit line. This voltage pulse will force the node A to be at a low voltage, or point 100 on FIG. 4, which is a stable point. Because it is at a stable point, node A will stay at a low voltage with only a very small current flowing.

To program the device to a high voltage state, the voltage pulse applied to the bit line while the word line receives a positive voltage, turning on transistor switch 5, is at a voltage $V_{dd}$, shown as an exemplary negative voltage of 0.6 volts in FIG. 4. This voltage pulse will force the node A to be at close to $V_{dd}$, or point 200 on FIG. 4, which is a stable point. Because it is at a stable point, node A will stay at $V_{dd}$ with only a very small current flowing.

To read out the voltage at node A, a positive voltage is pulsed to the word line to turn on the transistor switch 5. The state of node A is read through the transistor switch 5 by a peripheral circuit (not shown). Due to the high stability of the device, node A will stay at the current state, as long as the peripheral circuit does not pose a large enough disturbance to switch the state. A parasitic capacitor 35, as shown in FIG. 5, may also be located at node A.

Thus, the input voltage at the center point between the series-connected devices switches between $V_{dd}$ and $V_{ground}$ under the control of the switching transistor 5 and the voltage applied to the bit line and the circuit output is stable at close to $V_{dd}$ or $V_{ground}$. Anywhere between $V_{dd}$ and $V_{ground}$, the SRAM circuit is unstable and spurious noise will shift the circuit in one direction or the other, to $V_{dd}$ or $V_{ground}$. However, once the circuit is in one of the two logic states, it is stable and has the ability to withstand noise up to the peak voltages, $V_{peak1}$ and $V_{peak2}$, as shown in FIG. 4. It should be noted that the orientation/polarity of the devices may also be reversed such that $V_{dd}$ is positive and $V_{ground}$ is relatively negative or $V_{dd}$ is negative and $V_{ground}$ is relatively positive.

Figure 6:
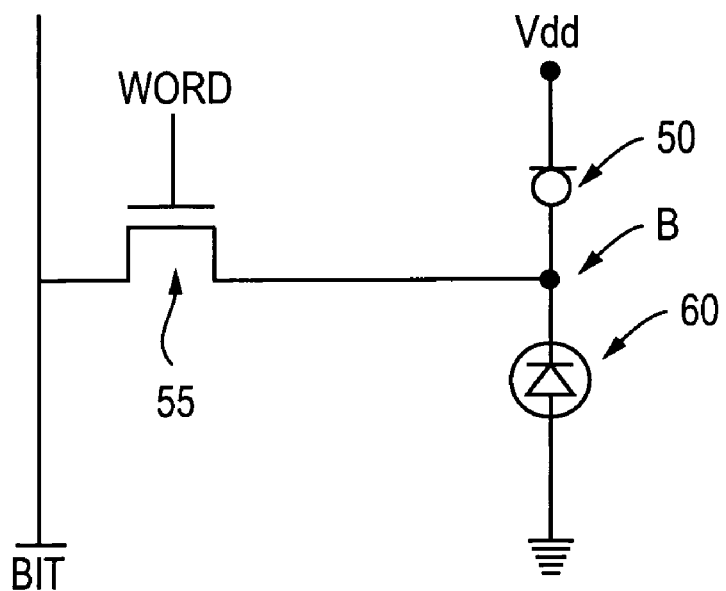
FIG. 6 is a circuit diagram of a memory cell according to another exemplary embodiment of the invention.
Figure 7:
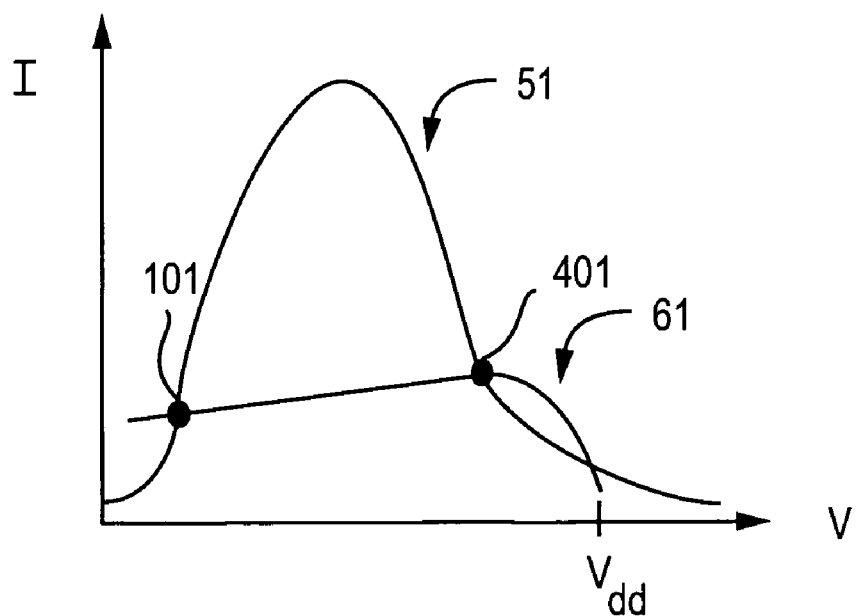
FIG. 7 is a current-voltage graph showing operation of the embodiment of the invention of FIG. 6.

Another embodiment of the present invention is illustrated in FIG. 6. The circuit of FIG. 6 uses one DNR chalcogenide device 50 and one reversely biased diode 60. The reversely biased diode 60 serves as a constant current source for the DNR chalcogenide device 50. Similar to the load-line curve in FIG. 4, the embodiment illustrated in FIG. 6 also has two stable operating points 101 and 401, where the load-line curve 51 of the DNR chalcogenide device 50 intersects with the load-line curve 61 of the reversely biased diode 60, as shown in FIG. 7. An input node is provided at a node B between the DNR chalcogenide device 50 and the reversely biased diode 60 to apply a voltage pulse to switch the memory and to output the state of the memory cell. The switching of the memory state is manifested in the output voltage at the output node B. It should be noted that the reversely biased diode 60 operates at a very low current, which provides the circuit with the additional advantage of low current consumption. The fabrication of a reversely biased diode may be performed according to any method known in the art.

Figure 5:
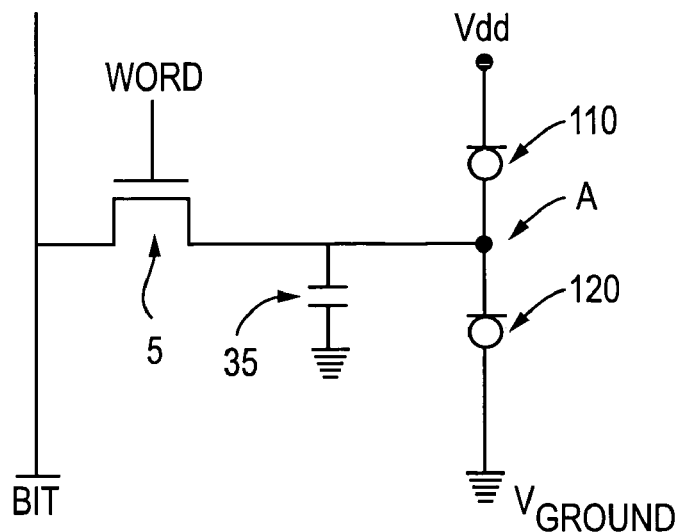
FIG. 5 is a circuit diagram of a memory cell according to another exemplary embodiment of the invention.
Figure 8:
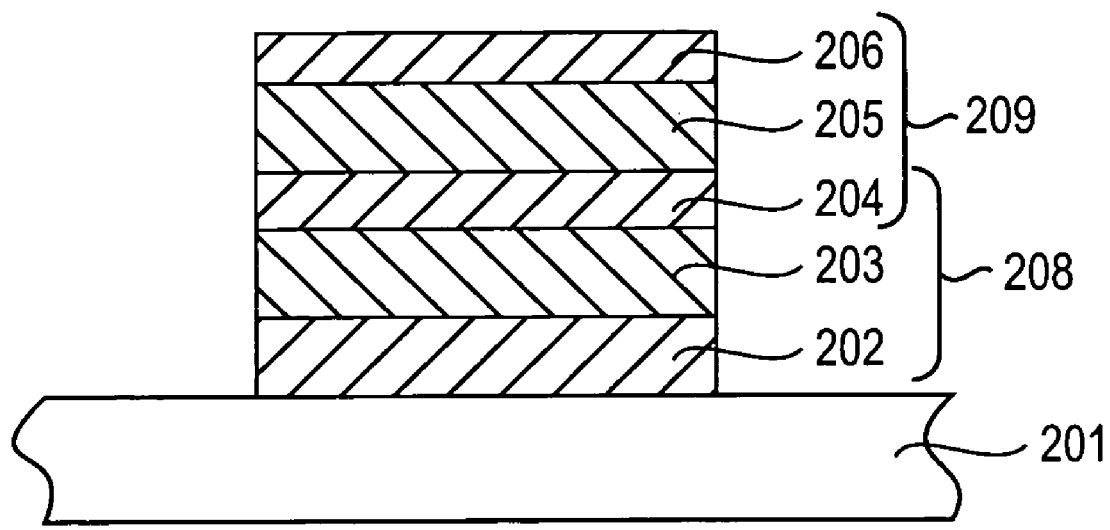
FIG. 8 is a cross-section of a memory cell according to an exemplary fabrication embodiment of the invention.

In the FIGS. 3 and 5 exemplary embodiments, two DNR chalcogenide devices are connected in series. An SRAM memory cell fabricated by stacking two DNR chalcogenide devices 208, 209 vertically to create a 4f2 design is shown in FIG. 8. The first DNR chalcogenide device 208 is coupled with a power supply Vdd, (not shown for simplicity) on a substrate 201. The first DNR chalcogenide device 208 comprises a first electrode 202 coupled to Vdd, a chalcogenide cell 203 having DNR characteristics, and a second electrode 204. The second electrode 204 of first DNR chalcogenide device 208, which is the connection node between the devices, is in electrical communication with the second DNR chalcogenide device 209, which comprises second electrode 204, a chalcogenide cell 205 having DNR characteristics, and a third electrode 206. Layers 203 and 205 may be multilayered devices, comprising, for example, a first chalcogenide glass layer, a metal-chalcogenide layer, and a second chalcogenide glass layer. The second DNR chalcogenide device 209 is coupled with Vground (not shown for simplicity) via third electrode 206. The switching voltage from the bit line as applied by the switch 5 of FIGS. 3, 5, and 6 is connected to second electrode 204, which acts as the second electrode of the first DNR chalcogenide device 208 and the first electrode of the second DNR chalcogenide device 209. Of course, the structure may also be inverted with electrode 206 being coupled to Vdd and electrode 202 coupled to ground. It should be noted that Vground may also be a low voltage relative to a higher voltage Vdd to switch the device.

Figure 9:
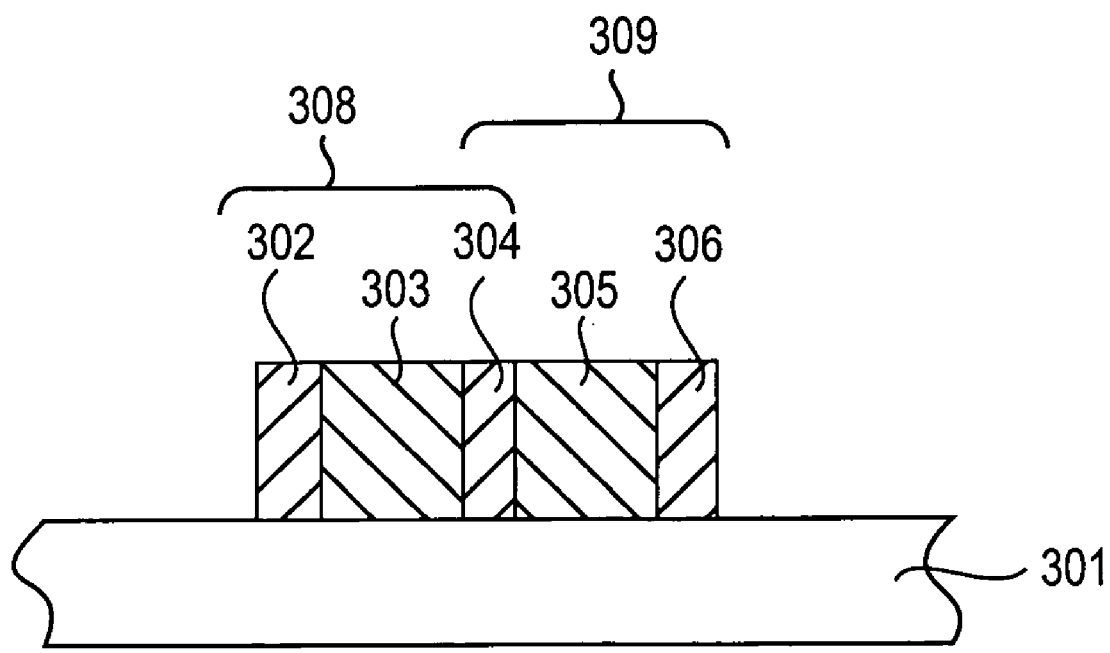
FIG. 9 is a cross-section of a memory cell according to another exemplary fabrication embodiment of the invention.

Alternatively, the cell may be fabricated by placing two DNR chalcogenide devices 308, 309 side-by-side over a substrate 301, as shown in FIG. 9. The first DNR chalcogenide device 308 is coupled with a power supply $V_{dd}$, (not shown for simplicity) at electrode 302. The first DNR chalcogenide device 308 comprises a first electrode 302, a chalcogenide cell 303, and a second electrode 304. The second electrode 304 of first DNR chalcogenide device 308 is in electrical communication with the second DNR chalcogenide device 309, which comprises the second electrode 304, a chalcogenide cell 305, and a third electrode 306. Layers 303 and 305 may be multilayered devices, comprising, for example, a first chalcogenide glass layer, a metal-chalcogenide layer, and a second chalcogenide glass layer. The second DNR chalcogenide device 309 is coupled with $V_{ground}$ at the electrode 306. The switching voltage as applied by the switch 5 of FIGS. 3, 5, and 6 is connected to second electrode 304, which is the node between the devices and which acts as the second electrode of the first DNR chalcogenide device 308 and the first electrode of the second DNR chalcogenide device 309. In this case, there is the added benefit of being able to produce both of first and second DNR chalcogenide devices 308 and 309 simultaneously.

It is worth noting that the current-voltage curve obtained by using such a DNR chalcogenide device has a peak-to-valley ratio of approximately 130 at room temperature. This peak-to-valley ratio is significantly higher than that of known devices such as Esaki diodes or resonant tunneling diodes which have a peak-to-valley ratio of less than about 125, providing the device of the present invention greater stability over devices of prior art. Thus the voltage states of all devices remain intact, even in the presence of levels of spurious noise which would interfere with SRAM cells constructed from other devices.

Advantageously, the device disclosed herein is highly stable with high switching speed and minimum power consumption. Further advantageously, the device disclosed herein occupies less chip space, compared with conventional SRAM technology, which requires four to six transistors. This memory technology is also compatible with dominant silicon-based CMOS technology.

Figure 10:
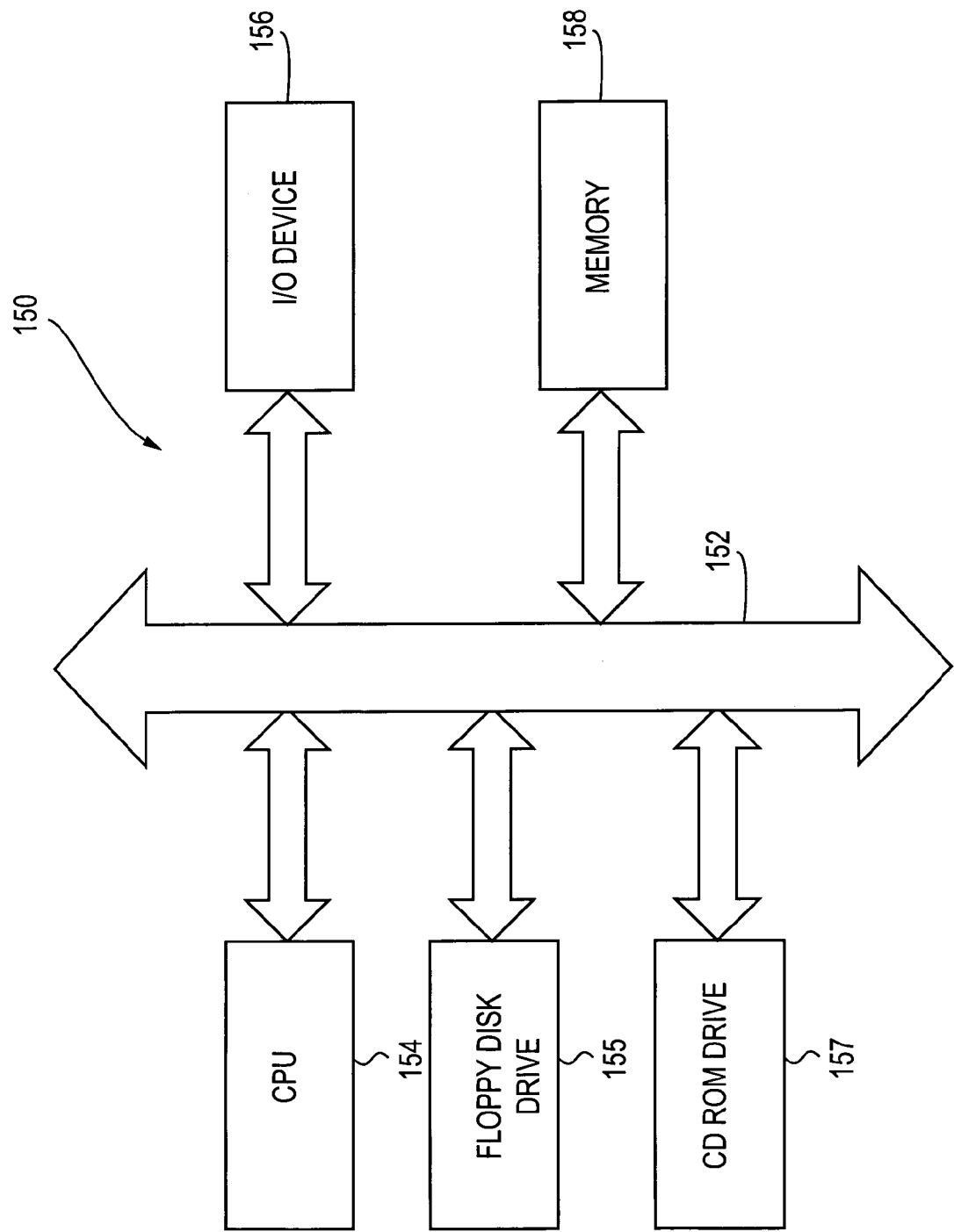
FIG. 10 is a processing system having a memory device according to the invention.

FIG. 10 is a simplified block diagram of a computer system 150, which includes a memory circuit 158, for example, an SRAM employing devices as illustrated in FIGS. 3, 5, and 6, in accordance with the invention. A processor system such as computer system, generally comprises a central processing unit (CPU) 154, such as a microprocessor, a digital signal processor, or other programmable digital logic device. Such devices communicate with an input/output (I/O) device 156 over a bus 152. The memory 158 communicates with the system over the bus 152, typically by a memory controller. In the case of a computer system, the processor may include peripheral devices such as a disk drive 155 and a CD-ROM drive 157, which also communicate with the CPU 154 over the bus 152. Memory 158 is preferably constructed as an integrated circuit, which includes one or more memory devices. If desired the memory 158 may be combined with the processor, for example CPU 154, in a single integrated circuit.

Various exemplary embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed as new and desired to be protected by Letters Patent of the United States is:

1. A memory device, comprising:
   a differential negative resistance chalcogenide device;
   a reversely biased diode electrically connected in series with said differential negative resistance chalcogenide device, said series connection of said differential negative resistance chalcogenide device and said reversely biased diode forming a connection node which provides a voltage representing the stage state of said memory device; and
   a switch coupled to said connection node for coupling said voltage to said connection node and switching the memory state of said memory device.

2. The memory device of claim 1, wherein said differential negative resistance chalcogenide device and said reversely biased diode are stacked on top of each other and share a common electrode.

3. The memory device of claim 1, wherein said differential negative resistance chalcogenide device comprises:
   a first electrode and a second electrode; and
   a chalcogenide structure separating said first and second electrodes and in electrical communication therewith, said chalcogenide structure exhibiting differential negative resistance characteristics.

4. The memory device of claim 3, wherein said chalcogenide structure comprises a first chalcogenide glass layer, a metal-chalcogenide layer in contact with said first chalcogenide glass layer, and a second chalcogenide glass layer in contact with said metal-chalcogenide layer.

5. The memory device of claim 1, wherein said switch applies a low voltage to program said memory device with a low voltage state.

6. The memory device of claim 5, wherein said connection node applies a high voltage to program said memory device with a high voltage state.

7. The memory device of claim 1, further comprising a parasitic capacitance electrically connected to said connection node.

8. A static random access memory device, comprising:
a differential negative resistance chalcogenide device;
a reversely biased diode electrically connected in series with said differential negative resistance chalcogenide device, said series connection of said differential negative resistance chalcogenide device and said reversely biased diode forming a connection node; and
a switch coupled to said connection node for switching the memory state of said memory device.

9. The device of claim 8, wherein said differential negative resistance chalcogenide device comprises:
a first electrode and a second electrode; and
a resistance variable region separating said first and second electrodes and in electrical communication therewith, said resistance variable region exhibiting differential negative resistance memory behavior and storing at least one memory state in response to applied voltage.

10. A method of forming a memory device, comprising:
forming a first differential negative resistance chalcogenide device;
forming a second differential negative resistance chalcogenide device at the same time as said step of forming said first differential negative resistance chalcogenide device;
forming an electrode between said first and second differential negative resistance chalcogenide devices, the electrode being common to the first and second differential negative resistance chalcogenide devices and the first and second differential negative resistance chalcogenide devices being stacked; and
forming a switching element coupled to said electrode.

11. A method of forming a memory device, comprising:
forming a first differential negative resistance chalcogenide device;
forming a second differential negative resistance chalcogenide device at the same time as said step of forming said first differential negative resistance chalcogenide device;
forming an electrode between said first and second differential negative resistance chalcogenide devices;
forming a switching element coupled to said electrode; and
connecting said first differential negative resistance chalcogenide device and said second differential negative resistance chalcogenide device in series to a pair of supply terminals, one for using a first reference voltage and the other for using a second reference voltage.

12. The method of claim 11, wherein said first reference voltage is negative relative to said second reference voltage.

13. The method of claim 10, further comprising electrically connecting a parasitic capacitor to said electrode.

14. A method of forming a static random access memory device, comprising:
forming a differential negative resistance chalcogenide device;
forming a reversely biased diode;
forming an electrode between said differential negative resistance chalcogenide device and said reversely biased diode; and
forming a switching element coupled to said electrode.

15. A processing system comprising:
a processor;
a memory device comprising:
a first differential negative resistance chalcogenide device;
a second differential negative resistance chalcogenide device electrically connected in series with said first differential negative resistance chalcogenide device, said series connection of said first and second differential negative resistance chalcogenide devices forming a connection node, said first and second differential negative resistance chalcogenide devices being connected to a pair of supply terminals, one for using a first reference voltage and the other for using a second reference voltage, wherein said first reference voltage is negative relative to said second reference voltage; and
a switch coupled to said connection node for switching the memory state of said memory device.

16. The system of claim 15, wherein at least said first differential negative resistance chalcogenide device comprises:
a first electrode and a second electrode; and
a resistance variable region separating said first and second electrodes and in electrical communication therewith, said resistance variable region exhibiting differential negative resistance memory behavior and storing at least one memory state as a read current amplitude in response to applied voltage.

17. A processing system comprising:
a processor;
a random access memory device coupled to said processor and comprising:
differential negative resistance chalcogenide device;
a reversely biased diode electrically connected in series with said differential negative resistance chalcogenide device, said series connection of said differential negative resistance chalcogenide device and said reversely biased diode forming a connection node; and
a switch coupled to said connection node for switching the memory state of said memory device.

18. The system of claim 17, wherein said differential negative resistance chalcogenide device comprises:
a first electrode and a second electrode; and
a resistance variable region separating said first and second electrodes and in electrical communication therewith, said resistance variable region exhibiting differential negative resistance memory behavior and storing at least one memory state as a read current amplitude in response to applied voltage.

19. A memory array comprising:
a plurality of memory cells, each memory cell comprising:
a first differential negative resistance chalcogenide device;
a second reversely biased diode for storing a second charge electrically connected in series with said first differential negative resistance chalcogenide device, said series connection of said first differential negative resistance chalcogenide device and said second reversely biased diode forming a connection node for providing an output voltage; and
a switch coupled to said connection node for switching the memory state of said memory device.

20. A memory element, comprising:
a first chalcogenide device;
a second device electrically connected in series with said first chalcogenide device, said series connection of said first chalcogenide device and said second device forming a connection node, wherein said second device is a reversely biased diode;

a switch coupled to said connection node; and a capacitor electrically connected to said connection node.

21. The memory element of claim 20, wherein said second device is a second chalcogenide device.

22. The memory element of claim 20, wherein said first chalcogenide device comprises:

a first electrode;

a second electrode; and a chalcogenide layer formed between said first electrode and said second electrode.

23. The memory element of claim 22, wherein said chalcogenide layer comprises at least one chalcogenide glass layer and at least one metal-chalcogenide layer.

24. The memory element of claim 21, wherein said first chalcogenide device and said second chalcogenide device each comprise:

a first electrode;

a second electrode; and a chalcogenide layer formed between said first electrode and said second electrode, wherein said second electrode of said first chalcogenide device is said first electrode of said second chalcogenide device.

25. The memory element of claim 24, wherein said chalcogenide layer comprises at least one chalcogenide glass layer and at least one metal-chalcogenide layer.

26. The memory element of claim 21, wherein said first and second chalcogenide devices are provided in side-by-side configuration.

27. A method of forming a memory device, comprising:

forming a first differential negative resistance chalcogenide device;

forming a second differential negative resistance chalcogenide device;

forming an electrode between said first and second differential negative resistance chalcogenide devices;

forming a switching element coupled to said electrode; and connecting said first differential negative resistance chalcogenide device and said second differential negative resistance chalcogenide device in series to a pair of supply terminals, one for using a first reference voltage and the other for using a second reference voltage, said first reference voltage being negative relative to said second reference voltage.

28. A method of forming a memory element, comprising:

forming a first chalcogenide device;

forming a reversely biased diode electrically connected in series with said first chalcogenide device, said series connection of said first chalcogenide device and said second device forming a connection node;

forming a switch coupled to said connection node; and forming a capacitor electrically connected to said connection node.

* * * * *